(12) United States Patent
Shirakawa

(10) Patent No.: US 12,443,106 B2
(45) Date of Patent: Oct. 14, 2025

(54) AQUEOUS DEVELOPER FOR FLEXOGRAPHIC PRINTING PLATE AND MANUFACTURING METHOD OF FLEXOGRAPHIC PRINTING PLATE

(71) Applicant: FUJIFILM Corporation, Tokyo (JP)

(72) Inventor: Masato Shirakawa, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 21 days.

(21) Appl. No.: 18/175,053

(22) Filed: Feb. 27, 2023

(65) Prior Publication Data

US 2023/0221647 A1 Jul. 13, 2023

Related U.S. Application Data

(63) Continuation of application No. PCT/JP2021/031456, filed on Aug. 27, 2021.

(30) Foreign Application Priority Data

Aug. 28, 2020 (JP) ................ 2020-144071

(51) Int. Cl.
*G03F 7/20* (2006.01)
*G03F 7/30* (2006.01)
*G03F 7/32* (2006.01)

(52) U.S. Cl.
CPC .......... *G03F 7/2012* (2013.01); *G03F 7/3057* (2013.01); *G03F 7/322* (2013.01)

(58) Field of Classification Search
CPC ...................................................... G03F 7/20
See application file for complete search history.

(56) References Cited

U.S. PATENT DOCUMENTS

2007/0254246 A1 11/2007 Oikawa
2022/0100095 A1* 3/2022 Yamada ................ B41C 1/1016

FOREIGN PATENT DOCUMENTS

| EP | 0279630 A1 * | 8/1988 | |
|---|---|---|---|
| JP | 63-200154 A | 8/1988 | |
| JP | 7-295238 A | 11/1995 | |
| JP | H07295238 A * | 11/1995 | |
| JP | 2000-282085 A | 10/2000 | |
| JP | 2001-117240 A | 4/2001 | |
| JP | 2002-123001 A | 4/2002 | |
| JP | 2004-317660 A | 11/2004 | |
| JP | 2005-77464 A | 3/2005 | |
| JP | 2009-47927 A | 3/2009 | |
| JP | 2009-210809 A | 9/2009 | |
| JP | 2017165945 A * | 9/2017 | |
| WO | 2007/123226 A1 | 11/2007 | |
| WO | WO-2020196820 A1 * | 10/2020 | ........... B41C 1/1016 |

OTHER PUBLICATIONS

English Machine Translation of JP 2017013905 A (Year: 2025).*
International Search Report dated Nov. 16, 2021, issued in International Application No. PCT/2021/031456.
Written Opinion dated Nov. 16, 2021, issued in International Application No. PCT/2021/031456.
International Preliminary Report on Patentability (with translation of Written Opinion) dated Feb. 28, 2023, issued in International Application No. PCT/2021/031456.
Extended European Search Report dated Feb. 19, 2024 in European Application No. 21861701.7.
Notice of Reasons for Refusal dated Dec. 5, 2023 in Japanese Application No. 2022-545722.
Office Action issued May 28, 2024 in Japanese Application No. 2022-545722.
Office Action issued Jun. 6, 2024 in Chinese Application No. 202180052683.3.
Office Action issued Dec. 30, 2024 in Chinese Patent Application No. 202180052683.3.
Office Action dated Oct. 29, 2024 in Japanese Application No. 2022-545722.
Communication issued Mar. 4, 2025 in Japanese Application No. 2022-545722.

* cited by examiner

*Primary Examiner* — Chanceity N Robinson
(74) *Attorney, Agent, or Firm* — Sughrue Mion, PLLC

(57) ABSTRACT

An aqueous developer for a flexographic printing plate capable of maintaining good developability and suppressing aggregation of a dispersion in the developer diluted with water after repeated use is provided, as is a manufacturing method of a flexographic printing plate using the same. The aqueous developer for a flexographic printing plate contains a nonionic surfactant represented by Formula (1), and water, where Formula (1) is $R^1O\text{-}(AO)_n\text{—H}$. In Formula (1), $R^1$ represents a linear aliphatic hydrocarbon group having 9 to 30 carbon atoms, A represents an alkylene group having 2 to 4 carbon atoms, and n represents an integer of 7 or more, provided that a plurality of A's may be the same or different from each other.

7 Claims, No Drawings

AQUEOUS DEVELOPER FOR FLEXOGRAPHIC PRINTING PLATE AND MANUFACTURING METHOD OF FLEXOGRAPHIC PRINTING PLATE

CROSS-REFERENCE TO RELATED APPLICATIONS

This application is a Continuation of PCT International Application No. PCT/JP2021/031456 filed on Aug. 27, 2021, which claims priority under 35 U.S.C. § 119(a) to Japanese Patent Application No. 2020-144071 filed on Aug. 28, 2020. The above applications are hereby expressly incorporated by reference, in its entirety, into the present application.

BACKGROUND OF THE INVENTION

1. Field of the Invention

The present invention relates to an aqueous developer for a flexographic printing plate and a manufacturing method of a flexographic printing plate using the same.

2. Description of the Related Art

In recent years, various industries have started to reduce the use of organic solvents from the viewpoint of improving the working environment and preserving the global environment, and in a plate making step of a photosensitive flexographic printing plate used for printing, the use of an aqueous developable photosensitive resin plate is increasing.

For example, JP2004-317660A discloses "an aqueous developer composition for a photosensitive resin consisting of at least a surfactant (A), a pH adjuster (B), a washing accelerator (C), and water, in which the surfactant (A) includes an alkylene oxide adduct of a primary alcohol having at least HLB 12 to 16 and having 6 to 8 carbon atoms, the pH adjuster (B) is an inorganic salt, the pH of the aqueous developer is 8 to 13, and the washing accelerator (C) includes a compound represented by Formula (I) or (II),

in Formula (I), R and R1 represent an alkyl group or alkenyl group having 2 to 6 carbon atoms, A represents an alkylene group having 2 to 4 carbon atoms, and n represents a number of 1 to 5, and
in Formula (II), n is 6 to 20" ([claim 1]).

SUMMARY OF THE INVENTION

The present inventor has conducted an investigation on the aqueous developer disclosed in JP2003-287906A, and have found that developability is good. However, it has been clarified that, in a case of repeatedly using the aqueous developer for two or more developments, a dispersion aggregates in the developer diluted with water in a case where the developer remaining on a printing plate or a wall surface of a bathtub of a developing device is washed (rinsed) with water, and there are problems such as that the dispersion reattaches to the printing plate and stains the printed article, and that maintainability of a developing device is affected.

An object of the present invention is to provide an aqueous developer for a flexographic printing plate capable of maintaining good developability and suppressing aggregation of a dispersion in the developer diluted with water after repeated use, and a manufacturing method of a flexographic printing plate using the same.

As a result of conducting intensive investigations to achieve the above-described object, the present inventor has found that an aqueous developer in which a nonionic surfactant having a predetermined structure is formulated is capable of maintaining good developability and suppressing the aggregation of the dispersion in the developer diluted with water after repeated use, and thus completed the present invention.

That is, the present inventor has found that the above-described object can be achieved by adopting the following configurations.

[1] An aqueous developer for a flexographic printing plate, comprising:
a nonionic surfactant represented by Formula (1); and water,

here, in Formula (1),
$R^1$ represents a linear aliphatic hydrocarbon group having 9 to 30 carbon atoms,
A represents an alkylene group having 2 to 4 carbon atoms, and
n represents an integer of 7 or more, in which in a case where n is an integer of 2 or more, a plurality of A's may be the same or different from each other.

[2] The aqueous developer for a flexographic printing plate according to [1],
in which n in Formula (1) is an integer of 10 or more.

[3] The aqueous developer for a flexographic printing plate according to [1] or [2],
in which n in Formula (1) is an integer of 15 or more.

[4] The aqueous developer for a flexographic printing plate according to any one of [1] to [3],
in which $R^1$ in Formula (1) has an ethylenically unsaturated double bond.

[5] The aqueous developer for a flexographic printing plate according to any one of [1] to [4], further comprising:
an anionic surfactant represented by Formula (2),

here, in Formula (2),
$R^2$ represents an aliphatic hydrocarbon group having 7 to 15 carbon atoms, and
X represents a carboxylic acid group or a salt of the carboxylic acid group, a sulfonic acid group or a salt of the sulfonic acid group, a sulfate group or a salt of the sulfate group, or a phosphoric acid group or a salt of the phosphoric acid group.

[6] A manufacturing method of a flexographic printing plate having a non-image area and an image area, the manufacturing method comprising:
an exposure step of imagewise exposing a photosensitive layer in a flexographic printing plate precursor having the photosensitive layer;
a development step of, after the exposure step, performing development using the aqueous developer for a flexographic printing plate according to any one of [1] to [5] to form a non-image area and an image area; and
a rinse step of, after the development step, performing rinsing with water.

According to the present invention, it is possible to provide an aqueous developer for a flexographic printing plate capable of maintaining good developability and suppressing aggregation of a dispersion in the developer diluted with water after repeated use, and a manufacturing method of a flexographic printing plate using the same.

DESCRIPTION OF THE PREFERRED EMBODIMENTS

Hereinafter, the present invention will be described in detail.

The description of configuration requirements described below may be made on the basis of representative embodiments of the present invention, but it should not be construed that the present invention is limited to those embodiments.

In the specification of the present application, the numerical range expressed by using "to" means a range including the numerical values before and after "to" as the lower limit value and the upper limit value.

In addition, in this specification, for each component, one kind of substance corresponding to each component may be used alone, or two or more kinds thereof may be used in combination. Here, in a case where two or more kinds of substances are used in combination for each component, the content of the component indicates the total content of the substances used in combination, unless otherwise specified.

Aqueous Developer for Flexographic Printing Plate

The aqueous developer for a flexographic printing plate according to an embodiment of the present invention (hereinafter, also abbreviated as an "aqueous developer according to the embodiment of the present invention") is an aqueous developer for a flexographic printing plate, containing a nonionic surfactant represented by Formula (1) described later (hereinafter, also abbreviated as a "specific surfactant") and water.

In the present invention, as described above, the aqueous developer formulating the specific surfactant is capable of maintaining good developability and suppressing the aggregation of a dispersion in the developer diluted with water after repeated use.

Although the details thereof are not clear, the present inventor has presumed as follows.

First, the aqueous developer is usually used repeatedly for two or more times of development, but for example, in the developer used for the second development, a plate material removed from the flexographic printing plate precursor by the first development, that is, a plate material in a non-exposed portion (uncured portion) is present as a dispersion.

Therefore, in the present invention, it is considered that this is because, by formulating the specific surfactant, the specific surfactant and the dispersion are adsorbed to each other, and the adsorbed state can be maintained even in a case of being diluted with water assuming a rinse step.

Specifically, since the number of carbon atoms in the linear aliphatic hydrocarbon group represented by $R^1$ in Formula (1) described later is 9 to 30, affinity with the dispersion is improved, so that it is considered that the adsorbed state can be maintained even in a case of being diluted with water.

In addition, since n in Formula (1) described later is an integer of 7 or more, the alkylene oxide is increased, and as a result, it is considered that the larger steric repulsive force between the dispersions prevents the dispersions from aggregating together.

Hereinafter, each component contained in the aqueous developer according to the embodiment of the present invention will be described in detail.

Specific Surfactant

The specific surfactant contained in the aqueous developer according to the embodiment of the present invention is a nonionic surfactant represented by Formula (1).

$$R^1O\text{-}(AO)_n\text{—}H \tag{1}$$

Here, in Formula (1), $R^1$ represents a linear aliphatic hydrocarbon group having 9 to 30 carbon atoms, A represents an alkylene group having 2 to 4 carbon atoms, and n represents an integer of 7 or more, in which in a case where n is an integer of 2 or more, a plurality of A's may be the same or different from each other.

Examples of the linear aliphatic hydrocarbon group having 9 to 30 carbon atoms, represented by $R^1$ in Formula (1), include an alkyl group, an alkenyl group, and an alkynyl group.

Here, the alkenyl group refers to a monovalent group obtained by removing one hydrogen atom from any carbon atom of alkene, and a liberated atomic value may be on an unsaturated carbon atom or on a saturated carbon atom.

In addition, the alkynyl group refers to a monovalent group obtained by removing one hydrogen atom from any carbon atom of alkyne, and a liberated atomic value may be on an unsaturated carbon atom or on a saturated carbon atom.

Specific examples of the alkyl group include a nonyl group, a decyl group, an undecyl group, a dodecyl group, a tridecyl group, a tetradecyl group, a pentadecyl group, a hexadecyl group, a heptadecyl group, and an octadecyl group.

Specific examples of the alkenyl group include a nonenyl group, a decenyl group, an undecenyl group, a dodecenyl group, a tridecenyl group, a tetradecenyl group, a pentadecenyl group, a hexadecenyl group, a heptadecenyl group, and an octadecenyl group.

Specific examples of the alkynyl group include a nonynyl group, a decynyl group, an undecynyl group, a dodecynyl group, a tridecynyl group, a tetradecynyl group, a pentadecynyl group, a hexadecynyl group, a heptadecynyl group, and an octadecynyl group.

In addition, the number of carbon atoms in the linear aliphatic hydrocarbon group represented by $R^1$ is 9 to 30, preferably 10 to 20, and more preferably 12 to 18.

In the present invention, from the reason that the aggregation of the dispersion can be further suppressed, $R^1$ in Formula (1) preferably has an ethylenically unsaturated double bond (carbon-carbon double bond), and more preferably has one carbon-carbon double bond.

A in Formula (1) represents an alkylene group having 2 to 4 carbon atoms, and is preferably an alkylene group having 2 or 3 carbon atoms and more preferably an ethylene group or an n-propylene group.

n in Formula (1) represents an integer of 7 or more, and from the reason that the aggregation of the dispersion can be further suppressed, it is preferably an integer of 10 or more and more preferably an integer of 15 or more.

In addition, the upper limit value of n in Formula (1) is not particularly limited, but is preferably 40 or less and more preferably 25 or less.

In the present invention, from the reason that the aggregation of the dispersion can be further suppressed, a Hydrophile-Lipophile Balance (HLB) value of the specific surfactant is preferably 10 to 17 and more preferably 12 to 15. In a case where the HLB value is 10 to 17, solubility of the specific surfactant in water is appropriately suppressed, and it is considered that, since a stable emulsion (suspension) can be formed, the aggregation of the dispersion can be further suppressed.

Here, as the HLB value, a value obtained by Griffin's calculation expression is adopted.

In the Griffin's calculation expression, the HLB value is calculated according to the following expression using a value of S (saponification of ester) and a value of N (neutralization of fatty acid constituting ester).

As the HLB value is closer to 20, it is more hydrophilic, and as the HLB value is closer to 0, it is more lipophilic.

HLB value=20(1−S/N)

Specific examples of the specific surfactant include polyoxyethylene lauryl ether, polyoxyethylene tridecyl ether, polyoxyethylene cetyl ether, polyoxyethylene stearyl ether, and polyoxyethylene oleyl ether.

In the present invention, a content of the specific surfactant is preferably 0.1% to 20% by mass, more preferably 0.1% to 10% by mass, and still more preferably 0.5% to 5% by mass.

Water

The water contained in the aqueous developer according to the embodiment of the present invention is not particularly limited, and any of purified water, distilled water, ion exchange water, pure water, ultrapure water such as Milli-Q water can be used. The Milli-Q water is ultrapure water obtained by a Milli-Q water production device, which is an ultrapure water production device manufactured by Merck KGaA.

A content of water contained in the aqueous developer according to the embodiment of the present invention is preferably 80% to 99.99% by mass and more preferably 90% to 99.9% by mass with respect to the total mass of the aqueous developer.

Anionic Surfactant

From the reason that the developability is improved and stability of a concentrated solution in which the aqueous developer is concentrated is improved, the aqueous developer according to the embodiment of the present invention preferably contains an anionic surfactant represented by Formula (2).

R²—X  (2)

Here, in Formula (2),

R² represents an aliphatic hydrocarbon group having 7 to 15 carbon atoms, and

X represents a carboxylic acid group or a salt of the carboxylic acid group, a sulfonic acid group or a salt of the sulfonic acid group, a sulfate group or a salt of the sulfate group, or a phosphoric acid group or a salt of the phosphoric acid group.

Examples of the aliphatic hydrocarbon group having 7 to 15 carbon atoms, represented by R² in Formula (2), include an alkyl group, an alkenyl group, and an alkynyl group.

Specific examples of the alkyl group include linear alkyl groups such as an octyl group, a nonyl group, a decyl group, a dodecyl group, and a tetradecyl group; and branched alkyl groups such as an isooctyl group, a 2-ethylhexyl group, an isodecyl group, an isododecyl group, and an isotetradecyl group.

Specific examples of the alkenyl group include a heptenyl group, an octenyl, a nonenyl group, a decenyl group, an undecenyl group, a dodecenyl group, a tridecenyl group, a tetradecenyl group, and a pentadecenyl group.

Specific examples of the alkynyl group include a heptynyl group, an octynyl group, a nonynyl group, a decynyl group, an undecynyl group, a dodecynyl group, a tridecynyl group, a tetradecynyl group, and a pentadecynyl group.

As described above, X in Formula (2) represents a carboxylic acid group or a salt of the carboxylic acid group, a sulfonic acid group (—SO₃H) or a salt of the sulfonic acid group, a sulfate group (—OSO₃H) or a salt the sulfate group, or a phosphoric acid group (—OPO₃H₂) or a salt of the phosphoric acid group, and among these, a carboxylic acid group (—COOH) or a salt of the carboxylic acid group, a sulfonic acid group or a salt of the sulfonic acid group, or a phosphoric acid group or a salt the phosphoric acid group is preferable, and a carboxylic acid group or a salt of the carboxylic acid group is more preferable.

In addition, the salt of the carboxylic acid group and the like is preferably an alkali metal salt such as a sodium salt and a potassium salt.

Specific examples of the anionic surfactant represented by Formula (2) include sodium laurate, potassium laurate, sodium oleate, and potassium palmitate.

In the present invention, a content of the anionic surfactant represented by Formula (2) in a case of being contained is preferably 0.01% to 10% by mass and more preferably 0.1% to 2% by mass with respect to the total mass of the aqueous developer.

Alkali Agent

From the reason that the developability is improved, it is preferable that the aqueous developer according to the embodiment of the present invention contains an alkali agent.

Examples of the alkali agent include an alkali metal carbonate and an alkali metal hydroxide.

Here, specific examples of the alkali metal include sodium, potassium, and calcium.

In addition, specific examples of the alkali metal carbonate include sodium carbonate, and potassium carbonate, and among these, sodium carbonate is preferable from the viewpoint of safety.

In addition, specific examples of the alkali metal hydroxide include sodium hydroxide and potassium hydroxide.

A content of the alkali agent in a case of being contained is preferably 0.01% to 5% by mass and more preferably 0.05% to 3% by mass with respect to the total mass of the aqueous developer.

Chelating Agent

From the reason that the aggregation of the dispersion can be further suppressed, the aqueous developer according to the embodiment of the present invention preferably contains a chelating agent.

Specific examples of the chelating agent include citric acid, ethylenediaminetetraacetic acid (EDTA), ethylenediamine-N,N'-disuccinic acid (EDDS), L-glutamate diacetic acid (GLDA), and an alkali metal salt thereof.

Other Components

In the aqueous developer according to the embodiment of the present invention, various additives may be formulated as optional components, as required.

Examples of the additives include alkanolamine such as ethanolamine; preservatives such as benzotriazole and benzoic acid; freezing point depressants such as glycols (for example, ethylene glycol) and lower alcohols (for example, ethanol); and antifoaming agents such as silicones and polyols, and these can be appropriately formulated within a range which does not impair the effects of the present invention.

Development Method

As a development method using the aqueous developer according to the embodiment of the present invention, the same method as a developing method using a known aqueous developer in the related art may be used, and examples thereof include a method of bringing an aqueous developer into contact with a non-exposed portion of a flexographic printing plate precursor, applying a physical action of a brush, water pressure, supersonic waves, or the like, and dispersing a photosensitive layer (photosensitive resin composition) that constitutes the non-exposed portion in the aqueous developer to remove the photosensitive layer.

In this case, the non-exposed portion may be immersed in the aqueous developer, or the aqueous developer may be continuously supplied and brought into contact with the non-exposed portion in a case where a physical action is exerted.

In addition, the liquid temperature of the aqueous developer during development is preferably 20° C. to 60° C. and more preferably 30° C. to 50° C.

In addition, a brush is used for the physical action force usually used, and the material, thickness, and length of bristles, denseness and arrangement of bristles, movement and rotation direction of brush, and the like are appropriately selected.

Flexographic Printing Plate Precursor

For the photosensitive layer (photosensitive resin composition) of the flexographic printing plate precursor developed with the aqueous developer according to the embodiment of the present invention, a known photosensitive resin composition in the related art can be used. Examples thereof include a resin composition containing a water-dispersible latex, rubber, a photopolymerizable monomer, a photopolymerization initiator, and a surfactant.

Water-Dispersible Latex

The water-dispersible latex contained in the resin composition is not particularly limited, and water-dispersible latexes used in a known flexographic printing plate in the related art can be used.

Specific examples of the water-dispersible latex include water-dispersible latex polymers such as polybutadiene latex, natural rubber latex, styrene-butadiene copolymer latex, acrylonitrile-butadiene copolymer latex, polychloroprene latex, polyisoprene latex, polyurethane latex, methyl-methacrylate-butadiene copolymer latex, vinylpyridine polymer latex, butyl polymer latex, Thiokol polymer latex, and acrylate polymer latex; and polymers obtained by copolymerizing another component, such as acrylic acid and methacrylic acid, therewith. These may be used alone or in combination of two or more.

Rubber

The rubber contained in the resin composition is not particularly limited, and rubber materials used in a known flexographic printing plate in the related art can be used.

Specific examples of the rubber include butadiene rubber (BR), nitrile rubber (NBR), acrylic rubber, epichlorohydrin rubber, urethane rubber, isoprene rubber, styrene isoprene rubber, styrene butadiene rubber, ethylene-propylene copolymer, and chlorinated polyethylene. These may be used alone or in combination of two or more.

Photopolymerizable Monomer

The photopolymerizable monomer contained in the resin composition is not particularly limited, and photopolymerizable monomers used in a known flexographic printing plate in the related art can be used.

Examples of the photopolymerizable monomer include ethylenically unsaturated compounds.

Specific examples of the ethylenically unsaturated compound include (meth)acrylic monomers, (meth)acrylic oligomers, and (meth)acrylic modified polymers.

In addition, specific examples of the (meth)acrylic modified polymer include (meth)acrylic modified butadiene rubber and (meth)acrylic modified nitrile rubber.

The term "(meth)acrylic" is a notation meaning acrylic or methacrylic.

Photopolymerization Initiator

The photopolymerization initiator contained in the resin composition is not particularly limited as long as the photopolymerization of the above-described photopolymerizable monomer is initiated, and examples thereof include photopolymerization initiators such as alkylphenones, acetophenones, benzoin ethers, benzophenones, thioxanthones, anthraquinones, benzyls, and biacetyls.

Specific examples thereof include benzyl dimethyl ketal, 2-hydroxy-2-methyl-1-phenyl-propane-1-one, methyl-o-benzoylbenzoate, and 1-hydroxycyclohexyl phenyl ketone.

Surfactant

From the viewpoint of improving water developability, the resin composition preferably contains a surfactant.

Examples of the surfactant include a cationic surfactant, an anionic surfactant, and a nonionic surfactant. Among these, an anionic surfactant is preferable.

Specific examples of the anionic surfactant include:
aliphatic carboxylates such as sodium laurate, and sodium oleate;
higher alcohol sulfate salts such as sodium lauryl sulfate, sodium cetyl sulfate, and sodium oleyl sulfate;
polyoxyethylene alkyl ether sulfate ester salts such as sodium polyoxyethylene lauryl ether sulfate;
polyoxyethylene alkyl allyl ether sulfate ester salts such as sodium polyoxyethylene octyl phenyl ether sulfate and sodium polyoxyethylene nonyl phenyl ether sulfate;
alkyl sulfonates such as alkyl diphenyl ether disulfonate, sodium dodecyl sulfonate, and sodium dialkyl sulfosuccinate;
alkyl allyl sulfonates such as alkyl disulfonate, sodium dodecyl benzene sulfonate, sodium dibutyl naphthalene sulfonate, and sodium triisopropyl naphthalene sulfonate;
higher alcohol phosphate ester salts such as disodium lauryl phosphate monoester, and sodium lauryl phosphate diester; and polyoxyethylene alkyl ether phosphate ester salts such as disodium polyoxyethylene lauryl ether phosphate monoester, and sodium polyoxyethylene lauryl ether phosphate di ester.

These may be used alone or in combination of two or more.

Manufacturing Method of Flexographic Printing Plate

A manufacturing method of a flexographic printing plate according to an embodiment of the present invention includes an exposure step of imagewise exposing a photosensitive layer in a flexographic printing plate precursor having the photosensitive layer, a development step of, after the exposure step, performing development using the aqueous developer for a flexographic printing plate to form a non-image area and an image area, and a rinse step of, after the development step, performing rinsing with water.

Exposure Step

The exposure step is a step of imagewise irradiating the photosensitive layer with an actinic ray to induce crosslinking and/or polymerization of a region irradiated with the actinic ray and to cure the region.

The above-described exposure step can be performed by exposing the photosensitive layer through a mask provided on an outer surface side of the photosensitive layer.

In addition, it is also preferable to perform the exposure using a vacuum frame exposure device, and in this case, after the air between a relief forming layer and the mask is exhausted, the exposure with an actinic ray is performed.

In addition, the exposure may be performed in a state in which the oxygen concentration is lowered, or may be performed in the atmosphere. Although not particularly limited, from the viewpoint of preventing polymerization inhibition by oxygen, it is preferable that the exposure is performed at a low oxygen concentration.

Development Step

The development step is a step of performing developing using the above-described aqueous developer according to the embodiment of the present invention to form a non-image area and an image area, and the details are as described in the above-mentioned development method of the aqueous developer according to the embodiment of the present invention.

Rinse Step

The rinse step is a step of rinsing surfaces of the non-image area and the image area formed in the development step with water.

In the present invention, since the developer remaining on the surfaces of the non-image area and the image area is the above-described aqueous developer according to the embodiment of the present invention, even in a case where the aqueous developer is diluted with water used in the rinse step, adhesion and aggregation of the dispersion in the developer can be suppressed.

As a rinsing method in the rinse step, a method of washing with tap water, a method of spraying high pressure water, a method of rubbing the surfaces of the non-image area and the image area with a brush using a batch-type or transport-type brush type washing machine as a developing machine for flexographic printing plates mainly in the presence of water, and the like may be used.

Use

The aqueous developer for a flexographic printing plate according to the embodiment of the present invention can be used not only as an aqueous developer for a flexographic printing plate, but also as a washing solution for washing a wall surface of a bathtub of a developing device.

EXAMPLES

Hereinafter, the present invention will be described in more detail with reference to examples. Materials, amounts used, ratios, treatment contents, treatment procedures, and the like shown in the following examples can be appropriately changed without departing from the spirit of the present invention. Therefore, the scope of the present invention should not be construed as being limited by the following examples.

Synthesis of Nonionic Surfactant CW-1

Potassium hydroxide was added to octanol so that the concentration was 1% by mass, and the 20 molar equivalents of ethylene oxide was blown into 1 molar equivalent of octanol under the condition of 180±5° C. to obtain polyoxyethylene octyl ether. The number of moles of ethylene oxide to be added was confirmed by measuring the mass increase amount.

Examples 1 to 7 and Comparative Examples 1 to 5

Each water, alkali agent, nonionic surfactant, and anionic surfactant shown in Table 1 below were formulated to have parts by mass shown in Table 1 below, thereby preparing aqueous developers.

Evaluation

Developability

A cover film of a flexographic printing plate precursor [FLENEX FW-L2, manufactured by FUJIFILM Corporation] was peeled off, and the flexographic printing plate precursor was exposed with an exposure device in which 15 40 W chemical lamps were arranged for 2 seconds from a substrate side from a distance of 15 cm (back exposure).

Thereafter, development was performed for 3 minutes with a brush type washing machine (liquid temperature: 50° C.) containing each of the prepared aqueous developers.

Thereafter, the obtained flexographic printing plate was dried with hot air of 60° C. until the moisture was removed. The thickness of the obtained flexographic printing plate was measured using a constant pressure thickness measuring device, and the change in film thickness per minute (development speed) was calculated from the change in thickness before and after development. The evaluation was performed according to the following standard. The results are shown in Table 1 below. Practically, it is preferable that the evaluation is B or higher.

Evaluation Standard

A: development speed was 170 µm/min or more.

B: development speed was 100 µm/min or more and less than 170 µm/min.

C: development speed was less than 100 µm/min.

Suppression of Aggregation

A cover film of a flexographic printing plate precursor [FLENEX FW-L2, manufactured by FUJIFILM Corporation] was peeled off, and the flexographic printing plate precursor was exposed with an exposure device in which 15 40 W chemical lamps were arranged for 2 seconds from a substrate side from a distance of 15 cm (back exposure).

Thereafter, with a brush type washing machine (liquid temperature: 50° C.) containing each of the prepared aqueous developers, development was performed for an optional time so that the solid content of a developing residue (dispersion) was 7.0% by mass. The solid content of the developing residue was obtained by measuring 2.0 g of the aqueous developer used (hereinafter, also abbreviated as a "fatigue solution"), drying at 95° C. for 18 hours, and calculating solid content % in the fatigue solution from the weight change before and after drying.

Next, 50 cc of the fatigue solution was put into a 1000 cc plastic container containing 450 cc of water in advance, the mixture was stirred and allowed to stand for 12 hours, and aggregates in the liquid was visually observed and evaluated according to the following standard. The results are shown in Table 1 below.

Evaluation Standard

A: there were no large aggregates which could be visually identified.

B: slightly large aggregates which could be visually identified were generated.

C: small amount of large aggregates which could be visually identified was generated.

D: large amount of large aggregates which could be visually identified was generated.

Stability of Concentrated Solution

With regard to each aqueous developing concentrated solution obtained by preparing each aqueous developer at a concentration ratio of 10 times, a dissolved state at room temperature (23° C.) was visually observed and evaluated according to the following standard. The results are shown in Table 1 below. In a case where the evaluation is B or more, there is no practical problem.

Evaluation Standard

A: colorless and transparent
B: turbidity
C: two-layer separation
D: insoluble precipitate

TABLE 1

| | Water | | Alkali agent | | Nonionic surfactant | | | | |
| --- | --- | --- | --- | --- | --- | --- | --- | --- | --- |
| | | | | | | | | $R^1$ in Formula (1) | |
| | Material | % by mass | Material | % by mass | Product name and the like | Manufacturer | Number of carbon atoms | Ethylenically unsaturated double bond | Formula (1) A |
| Example 1 | Pure water | 98.9 | Sodium carbonate | 0.1 | Emulgen 108 | Kao Corporation | 12 | None | Ethylene group |
| Example 2 | Pure water | 98.9 | Sodium carbonate | 0.1 | Pionin D-1115 | TAKEMOTO OIL & FAT Co., Ltd. | 12 | None | Ethylene group |
| Example 3 | Pure water | 98.9 | Sodium carbonate | 0.1 | Pionin D-1315 | TAKEMOTO OIL & FAT Co., Ltd. | 16 | None | Ethylene group |
| Example 4 | Pure water | 98.9 | Sodium carbonate | 0.1 | Pionin D-1323 | TAKEMOTO OIL & FAT Co., Ltd. | 16 | None | Ethylene group |
| Example 5 | Pure water | 98.9 | Sodium carbonate | 0.1 | Pionin D-1420 | TAKEMOTO OIL & FAT Co., Ltd. | 18 | None | Ethylene group |
| Example 6 | Pure water | 98.9 | Sodium carbonate | 0.1 | Pionin D-1518 | TAKEMOTO OIL & FAT Co., Ltd. | 18 | Having | Ethylene group |
| Example 7 | Pure water | 97.75 | Sodium carbonate | 0.25 | Pionin D-1315 | TAKEMOTO OIL & FAT Co., Ltd. | 16 | None | Ethylene group |
| Comparative Example 1 | Pure water | 98.9 | Sodium carbonate | 0.1 | Pionin D-1004 | TAKEMOTO OIL & FAT Co., Ltd. | 8 | None | Ethylene group |
| Comparative Example 2 | Pure water | 98.9 | Sodium carbonate | 0.1 | Pionin D-1007 | TAKEMOTO OIL & FAT Co., Ltd. | 8 | None | Ethylene group |

TABLE 1-continued

| | | | | | | | | | |
|---|---|---|---|---|---|---|---|---|---|
| Comparative Example 3 | Pure water | 98.9 | Sodium carbonate | 0.1 | CW-1 | Synthetic product | 8 | None | Ethylene group |
| Comparative Example 4 | Pure water | 98.9 | Sodium carbonate | 0.1 | Emulgen 104P | Kao Corporation | 12 | None | Ethylene group |
| Comparative Example 5 | Pure water | 98.9 | Sodium carbonate | 0.1 | Polyoxyethylene (4) stearyl ether | FUJIFILM Wako Chemical Corporation | 18 | None | Ethylene group |

| | Nonionic surfactant | | | Anionic surfactant | | | Suppression of aggregation | Stability of concentrated solution |
|---|---|---|---|---|---|---|---|---|
| | Formula (1) B | HLB | % by mass | Material | % by mass | Developability | | |
| Example 1 | 8 | 12.1 | 1 | None | | B | A | B |
| Example 2 | 15 | 15.6 | 1 | None | | B | B | A |
| Example 3 | 15 | 14.6 | 1 | None | | B | A | B |
| Example 4 | 23 | 15.7 | 1 | None | | B | C | B |
| Example 5 | 20 | 15.3 | 1 | None | | B | B | B |
| Example 6 | 18 | 11.4 | 1 | None | | B | A | A |
| Example 7 | 15 | 14.6 | 1 | Sodium laurate | 1 | A | A | A |
| Comparative Example 1 | 4 | 11.6 | 1 | None | | B | D | C |
| Comparative Example 2 | 8 | 14.6 | 1 | None | | B | D | C |
| Comparative Example 3 | 20 | 17.4 | 1 | None | | B | D | B |
| Comparative Example 4 | 4 | 9.6 | 1 | None | | B | D | D |
| Comparative Example 5 | 4 | 7.9 | 1 | None | | B | D | D |

The following components were used as the components shown in Table 1 above.
Sodium carbonate: reagent manufactured by FUJIFILM Wako Chemical Corporation
Emulgen 108: polyoxyethylene lauryl ether (HLB: 12.0, manufactured by Kao Corporation)
Pionin D-1115: polyoxyethylene lauryl ether (manufactured by TAKEMOTO OIL & FAT Co., Ltd.)
Pionin D-1315: polyoxyethylene cetyl ether (manufactured by TAKEMOTO OIL & FAT Co., Ltd.)
Pionin D-1323: polyoxyethylene cetyl ether (manufactured by TAKEMOTO OIL & FAT Co., Ltd.)
Pionin D-1420: polyoxyethylene stearyl ether (manufactured by TAKEMOTO OIL & FAT Co., Ltd.)
Pionin D-1518: polyoxyethylene oleyl ether (manufactured by TAKEMOTO OIL & FAT Co., Ltd.)
Pionin D-1004: polyoxyethylene octyl ether (manufactured by TAKEMOTO OIL & FAT Co., Ltd.)
Pionin D-1007: polyoxyethylene octyl ether (manufactured by TAKEMOTO OIL & FAT Co., Ltd.)
CW-1: synthetic product described above
Emulgen 104P: polyoxyethylene lauryl ether (HLB: 9.7, manufactured by Kao Corporation)
Polyoxyethylene (4) stearyl ether: reagent manufactured by FUJIFILM Wako Chemical Corporation
Sodium laurate: reagent manufactured by FUJIFILM Wako Chemical Corporation As shown in Table 1, it was found that, in a case where $R^1$ in Formula (1) described above was an aliphatic hydrocarbon group having 8 carbon atoms, the aggregation of developing residue could not be suppressed regardless of the number of n in Formula (1) described above (Comparative Examples 1 to 3).

In addition, even in a case where $R^1$ in Formula (1) described above was a linear aliphatic hydrocarbon group having 9 to 30 carbon atoms, it was found that, in a case where n in Formula (1) described above was an integer of less than 7, the aggregation of developing residue could not be suppressed, and the stability of the concentrated solution was deteriorated (Comparative Examples 4 and 5).

On the other hand, it was found that, in a case where the specific surfactant was formulated, good developability could be maintained and the aggregation of the developing residue could be suppressed (Examples 1 to 7).

In particular, from the comparison between Example 3 and Example 7, it was found that, in a case where the anionic surfactant represented by Formula (2) described above was formulated, the developability was improved, and the stability of the concentrated solution obtained by concentrating the aqueous developer was improved.

In addition, from the comparison between Example 5 and Example 6, it was found that, in a case where $R^1$ in Formula (1) described above had an ethylenically unsaturated double bond (carbon-carbon double bond), the aggregation of developing residue in the fatigue solution could be further suppressed.

What is claimed is:

1. An aqueous developer for a flexographic printing plate, comprising:
    a nonionic surfactant represented by Formula (1);
    an anionic surfactant represented by Formula (2); and
    water, $$R^1O\text{-}(AO)_n\text{---}H \quad (1)$$

here, in Formula (1),
    $R^1$ represents a linear aliphatic hydrocarbon group having 9 to 30 carbon atoms,
    and wherein $R^1$ in Formula (1) has an ethylenically unsaturated double bond,
    A represents an alkylene group having 2 to 4 carbon atoms, and
    n represents an integer of 7 or more, in which in a case where n is an integer of 7 or more, a plurality of A's may be the same or different from each other, and
    a content of the nonionic surfactant is 0.5% to 5% by mass, $$R^2\text{---}X \quad (2)$$

here, in Formula (2),

R² represents an aliphatic hydrocarbon group having 7 to 15 carbon atoms, and

X represents a carboxylic acid group or a salt of the carboxylic acid group, a sulfonic acid group or a salt of the sulfonic acid group, a sulfate group or a salt of the sulfate group, or a phosphoric acid group or a salt of the phosphoric acid group.

2. The aqueous developer for a flexographic printing plate according to claim 1, wherein n in Formula (1) is an integer of 10 or more.

3. The aqueous developer for a flexographic printing plate according to claim 1, wherein n in Formula (1) is an integer of 15 or more.

4. A manufacturing method of a flexographic printing plate having a non-image area and an image area, the manufacturing method comprising:

an exposure step of imagewise exposing a photosensitive layer in a flexographic printing plate precursor having the photosensitive layer;

a development step of, after the exposure step, performing development using the aqueous developer for a flexographic printing plate according to claim 1 to form a non-image area and an image area; and a rinse step of, after the development step, performing rinsing with water.

5. The aqueous developer for a flexographic printing plate according to claim 2, wherein n in Formula (1) is an integer of 15 or more.

6. A manufacturing method of a flexographic printing plate having a non-image area and an image area, the manufacturing method comprising:

an exposure step of imagewise exposing a photosensitive layer in a flexographic printing plate precursor having the photosensitive layer;

a development step of, after the exposure step, performing development using the aqueous developer for a flexographic printing plate according to claim 2 to form a non-image area and an image area; and a rinse step of, after the development step, performing rinsing with water.

7. A manufacturing method of a flexographic printing plate having a non-image area and an image area, the manufacturing method comprising:

an exposure step of imagewise exposing a photosensitive layer in a flexographic printing plate precursor having the photosensitive layer;

a development step of, after the exposure step, performing development using the aqueous developer for a flexographic printing plate according to claim 3 to form a non-image area and an image area; and a rinse step of, after the development step, performing rinsing with water.

\* \* \* \* \*